United States Patent [19]

LeFever et al.

[11] 4,281,364
[45] Jul. 28, 1981

[54] MULTILAMP PHOTOFLASH UNIT CONSTRUCTION

[75] Inventors: Randall H. LeFever, Williamsport; William J. Harvey, Trout Run; Glen E. Flook, Jr., Williamsport, all of Pa.

[73] Assignee: GTE Products Corporation, Stamford, Conn.

[21] Appl. No.: 84,235

[22] Filed: Oct. 12, 1979

[51] Int. Cl.$^3$ ............................................. G03B 15/02
[52] U.S. Cl. ..................................... 362/10; 362/13; 362/240; 362/241
[58] Field of Search .................... 362/10, 13, 240, 241

[56] References Cited

U.S. PATENT DOCUMENTS 4,104,705  8/1978  Levand et al. ................... 362/13 X Primary Examiner—Stephen J. Lechert, Jr.
Attorney, Agent, or Firm—Edward J. Coleman

[57] ABSTRACT

A photoflash unit comprising a linear array of flashlamps mounted on a printed circuit board disposed within the longitudinal channel of an elongated housing member having an enclosing cover panel of light-transmitting material. The lamp firing circuitry includes a pair of spaced-apart common circuit conductor runs respectively located on opposite halves of the printed circuit board. The circuit board is secured to the rear wall of the housing channel by means of a staple having two legs extending through both the housing wall and circuit board, with the center region of the staple being disposed on the exterior of the channel wall. The staple legs are bent over in contact with respective ones of the common circuit runs to provide an interconnecting jumper therebetween and extend electrical ground to the exterior of the unit. The bent staple legs are also outwardly directed to contact a conductive-reflective coating on the channel sidewalls, thereby grounding the coating to provide an electrostatic shield.

8 Claims, 5 Drawing Figures

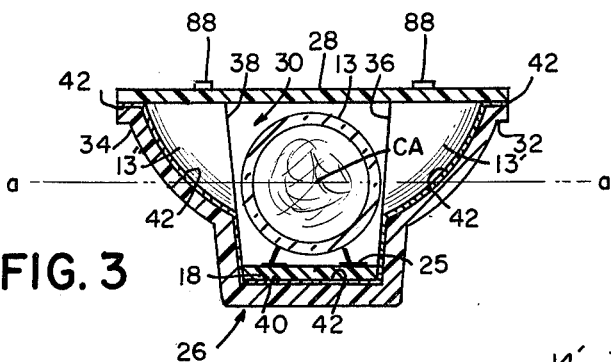
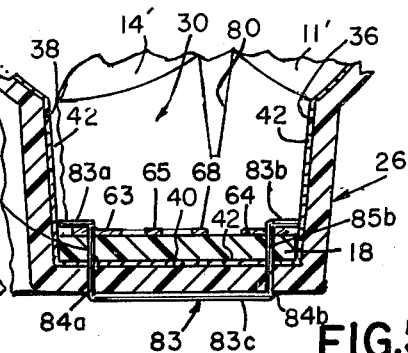
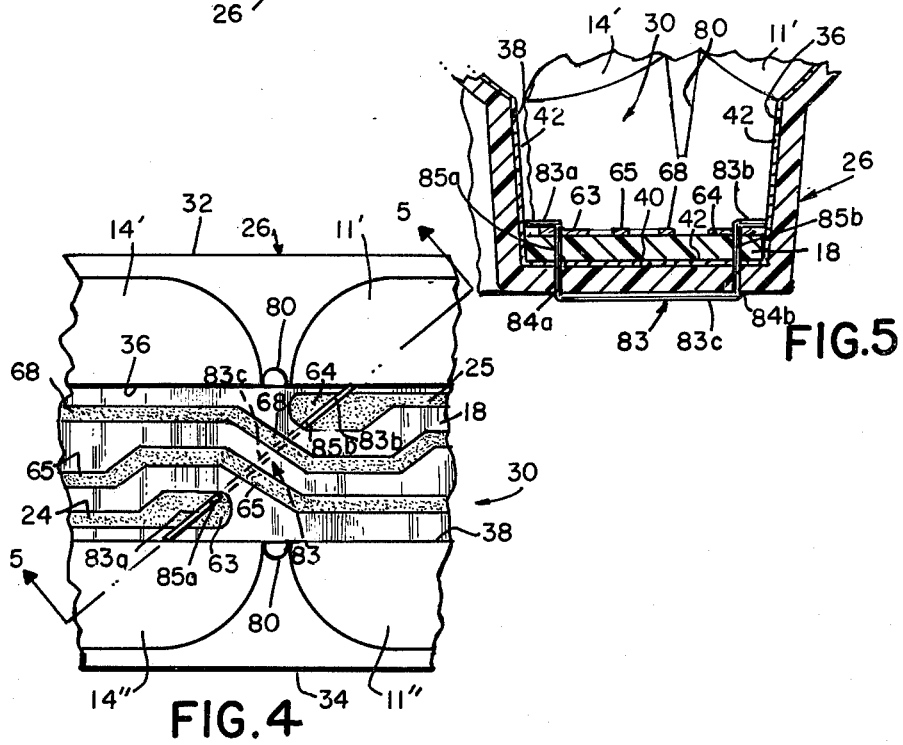

MULTILAMP PHOTOFLASH UNIT CONSTRUCTION

BACKGROUND OF THE INVENTION

This invention relates to multilamp photoflash units and, more particularly, to a high voltage photoflash unit construction with improved means for economically securing components and providing electrostatic protection.

Numerous multilamp arrangements with various types of sequencing circuits have been described in the prior art, particularly in the past few years. A currently marketed photoflash unit (described in U.S. Pat. Nos. 3,894,226 and 4,017,728 and referred to as flipflash) employs high voltage type lamps adapted to be ignited sequentially by successively applied high voltage firing pulses from a source such as a camera-shutter-actuated piezoelectric element. The flipflash unit comprises an elongated planar array of eight high-voltage type flashlamps mounted on a printed circuit board with an array of respectively associated reflectors disposed therebetween. The lamps are arranged in two groups of four disposed on the upper and lower halves respectively of the rectangular-shaped circuit board. A set of terminal contacts at the lower end of the unit is provided for activation of the upper group of lamps, while a set of terminal contacts at the top of the unit is operatively associated with the lower group of lamps. The application of successive high voltage pulses (e.g. 2000 to 4000 volts from, say, a piezoelectric source controlled by the shutter of a camera in which the array is inserted) to the terminal contact at the lower end of the unit causes the four lamps at the upper half of the array to be sequentially ignited. The array may then be turned end for end and again inserted into the camera in order to flash the remaining four lamps. In this manner one group of lamps (or half of the array) functions as a flash extender for the other group of lamps so that only the group of lamps relatively farther from the camera lens axis may be flashed. The purpose of such an arrangement is to position the active group of flashlamps farther above the camera lens in order to reduce the possibility of a "red-eye" effect that causes the pupils of a person's eyes to appear red or pink in flash pictures taken when the flashlamp is close to a camera lens.

In order to provide electrostatic shielding for the lamps and circuitry, the reflector member is rendered electrically conductive by a reflective metalized coating thereon, and this coating is electrically connected to a common circuit conductor run on the printed circuit board. Further, a metal foil is laminated on the indicia sheet and also connected to this common conductor run of the circuit board.

A copending patent application Ser. No. 072,251, assigned to the present assignee, describes a more compact, cost-efficient photoflash unit construction comprising a linear array of electrically ignitable flashlamps mounted on a printed circuit board in the form of an elongated strip. The printed circuit strip is located within the longitudinal channel of an elongated housing member having a continuous coating of conductive-reflective material thereon adjacent to the lamps. A light-transmitting cover panel is attached to the front of the housing member to enclose the flashlamps. The lamps have substantially tubular envelopes and are positioned extremely close to one another with their longitudinal axes substantially parallel to the surface of the printed circuit strip and in substantially coaxial alignment. Typically, the diameter of the lamps, the width of the printed circuit strip, and the width of the channel in the housing member are nearly equal. In order to provide protection against the red-eye effect, a double-ended linear array is described which operates in similar fashion to the aforementioned flipflash. In one specific embodiment, three lamps mounted in the upper half of the printed circuit strip are controlled by a pair of contact terminals at the lower end of the unit, while three lamps in the lower half of the unit are controlled by contact terminals at the top end of the unit. One of the contact terminals for controlling a group of lamps is connected in common to a lead-in wire of each of the lamps of the group, while the other contact is a "hot", or signal, terminal coupled through switching circuitry to the other lead-in wire of each of the lamps. Accordingly, in order to provide an interconnection between the signal terminals at each end of the unit and the respective switching circuitry controlled thereby on opposite halves of the printed circuit strip, respective signal conductor runs must be extended through the respectively inactive halves of the circuit strip. The interconnecting conductor runs from the common terminal contacts are disposed along the outer sides of the circuit-containing surface of the printed circuit board. More specifically, the common circuit conductor run on the bottom half of the circuit strip is located on the opposite side of the circuit board surface from the common circuit run on the top half of the circuit strip. As a result, a crossover, or side-to-side connection of the common circuit run is required in order to connect the common terminal at one end of the printed circuit strip with the common circuit conductor run connected to lamp leads in the opposite half of the circuit strip. Such a problem is created by the severe crowding of the conductive paths of this extremely compact unit. The use of printed conductor runs on both sides of the circuit strip with conventional through-connections introduces undesirable cost, e.g. two circuit screening operations are needed together with eyelets, plated-through holes, or the like. A minimum inter-run spacing of about 1.5 millimeters is necessary in order to prevent failure, i.e. promoting electrical sparkover from one run to another at the high voltages used (e.g., 2000 volts or more).

A copending patent application Ser. No. 084,236, filed concurrently herewith and assigned to the present assignee, overcomes the aforementioned problem of interconnecting the spaced common circuit runs by attaching a staple to the printed circuit board. The center region of the staple is positioned on the opposite side of the circuit board from the surface carrying the conductor runs, and the two legs of the staple extend through the circuit board and are bent over the conductor-carrying surface in contact with respective common circuit runs, thereby providing a jumper therebetween. Upon placing the circuit board in the housing channel, the center region of the staple is disposed between the circuit strip and channel wall in contact with the conductive-reflective coating. In this manner the conductive wall coating is grounded to common to provide an electrostatic shield for the unit.

Protection against electrostatic charges about the front face of the unit described in the above-referenced copending application Ser. Nos. 072,251 and 084,236, is provided in a manner following the teachings of U.S.

Pat. No. 4,133,424. More specifically, the light-transmitting cover panel is provided with a plurality of openings, and conductive projections from the housing member, protrude through the cover openings to extend the circuit ground to the exterior of the front face of the unit. The aforementioned constructions, however, do not provide such an exterior ground mode of protection for the rear of the unit.

Further yet, the comparatively simplified linear array structure described in the aforementioned copending applications has an open channel within which the strip-like printed circuit board is located. Accordingly, some means must be provided for securing the printed circuit strip within the housing channel. In the above-referenced application Ser. No. 072,251, location and centering of the circuit strip within the channel is provided by guide ribs, molded in opposite sidewalls of the channel, which engage notches provided in opposite edges of the circuit strip. In Ser. No. 084,236, the circuit strip is described as being secured to the channel by means such as providing an interference fit with the channel sidewalls or by applying a cement between the back of the strip 18 and the rear wall of the channel.

SUMMARY OF THE INVENTION

Accordingly, it is an object of the present invention to provide an improved multilamp photoflash unit of compact construction which economically includes means for both securing the printed circuit board to the housing member and significantly reducing inadvertant electrostatic flashing of lamps contained therein.

A further object is to additionally provide economical means for electrically interconnecting a pair of spaced-apart common circuit conductor runs on a printed circuit board in a compact multilamp photoflash unit having a simplified, more cost-efficient construction.

These and other objects, advantages and features are attained in a multilamp photoflash unit comprising a printed circuit board having lamp firing circuitry on a surface thereof to which the lead-in wires of an array of flashlamps are connected. The circuitry on the circuit board includes a common circuit conductor run connected electrically to one lead-in wire of each of the lamps. The unit further includes a housing member having a channel within which the printed circuit board is located, the circuit board being substantially parallel to a wall of the channel which faces the opposite side of the board from that carrying circuitry. The circuit board is secured to the channel wall by means of a staple having a pair of legs extending through both the channel wall and the circuit board. The center region of the staple is positioned on the exterior side of the wall and the staple legs are bent over the current-carrying surface of the circuit board with at least one of the staple legs being in contact with the common circuit conductor run, whereby the staple provides electrostatic protection by extending the electrical ground to the exterior of the unit.

Preferably, the staple is comprised of a non-corrosive material, such as Niron (nickel—iron alloys of Wilbur B. Driver, Co.), as rusting of the staple under humid conditions, or the like can cause the loss of electrical contact between the staple and the conductor run.

In a preferred embodiment, the circuit board is in the form of an elongated strip, the flashlamps are disposed in a linear array over the current-carrying surface of the circuit strip, and the housing member has an elongated configuration with the channel longitudinally disposed therein. The cross-section of the channel is substantially semi-rectangular, and the rear wall and opposite sidewalls of the channel are covered with a continuous coating of conductive-reflective material. The circuit board is parallel to the rear wall of the channel, and the staple legs extend through the rear wall for securing the circuit board thereto. The legs of the staple are bent outwardly away from each other and in contact, respectively, with the conductively coated opposite sidewalls of the channel, whereby the common circuit conductor run is connected to the conductive coating on the channel sidewalls so as to provide an electrostatic shield.

In a flipflash type of linear array, the flashlamps are divided into first and second groups of two or more lamps each disposed on respectively opposite halves of the printed circuit strip. The circuitry includes first and second common circuit conductor runs, with a first run connected electrically to one lead-in wire of each of the first group of lamps and the second common circuit run being connected electrically to one lead-in wire of each of the second group of lamps. The printed circuit strip includes first and second connector terminal means at respectively opposite ends, with the first connector terminal being located on the half of the circuit strip containing the first group of lamps and separated thereby from the second group of lamps and the second connector-terminal being located on the half of the circuit strip containing the second group of lamps and separated thereby from the first group of lamps. The first common circuit run extends to the first connector-terminal means and the second common circuit run extends to the second connector-terminal means. A portion of the circuitry couples the first connector-terminal means to each lamp of the second group of lamps and another portion of the circuitry couples the second connector-terminal means to each lamp of the first group of lamps. The first and second common-circuit conductor runs have respective spaced-apart terminations about the mid-portion of the circuit strip, and the legs of the staple are bent over the conductor-carrying surface of the circuit strip and in contact with respective ones of the terminations of the first and second runs. In this manner, the staple also functions as an interconnecting jumper or crossover connection, between the spaced-apart first and second conductor runs.

In summary, the staple of the aforementioned photoflash unit construction can economically, conveniently and compactly provide the combined functions of securing the circuit board to the housing member, providing a jumper between spaced-apart common circuit runs, grounding a conductive coating on the interior of the housing member for providing an electrostatic shield, and extending an exterior ground to the rear of the unit housing.

BRIEF DESCRIPTION OF THE DRAWINGS

This invention will be more fully described hereinafter in conjunction with the accompanying drawings in which:

FIG. 3 is an enlarged cross-sectional view taken along 3—3 of FIG. 1;

FIG. 4 is an enlarged fragmentary front view of the mid-portion of the housing and printed circuit strip of the unit of FIGS. 1–3, particularly showing staple attachment to the circuit strip; and FIG. 5 is a cross-sectional view taken along 5—5 of FIG. 4, showing the staple arrangement securing the circuit board to the rear wall of the housing member.

DESCRIPTIN OF PREFERRED EMBODIMENT

Figures 1, 2:
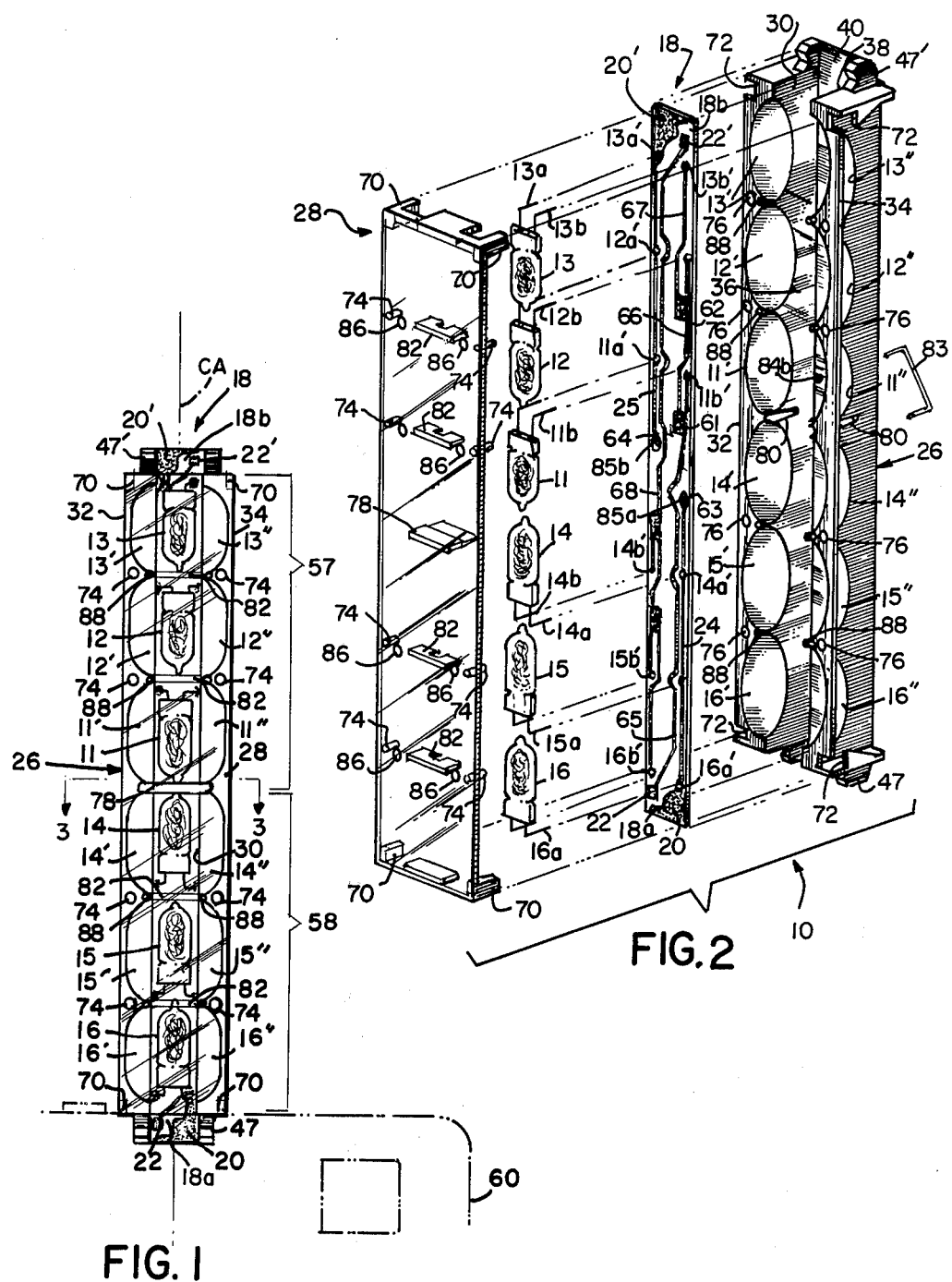
FIG. 1 is a front elevation of a multilamp photoflash unit in accordance with the invention, with the camera on which it is mounted shown in phantom.
FIG. 2 is an exploded perspective view of the photoflash unit of FIG. 1.

FIGS. 1 and 2 illustrate a multilamp photoflash unit 10 similar to that described in the aforementioned copending application Ser. No. 072,251. It comprises a linear array of six flashlamps 11–13 and 14–16 mounted on a printed circuit board 18 in the form of an elongated strip. Each of the lamps has a pair of lead-in wires 11a, 11b, etc., connected to the printed circuitry on strip 18. For example, the lead-in wires 11a, 11b, etc., may be soldered to respective connector pads 11a', 11b', etc., forming portions of the conductive circuit runs on strip 18. Each of the lamps 11, etc., has a tubular light-transmitting glass envelope having a press-seal base at one end through which the lead-in wires emerge, and an exhaust tip at the other end. The envelope is filled with a quantity of filamentary combustible material, such as shredded zirconium, and a combustion-supporting gas, such as oxygen. The ignition means within the lamp envelope may comprise, in the case of a low voltage source, a filament connected across the inner ends of the lead-in wires with beads of primer material disposed about the junctions of the lead-in wires and filament. In the case of a high voltage power source, for which the illustrated embodiment is particularly intended, the ignition structure may comprise a primer bridge or a spark gap type construction. For example a particularly suitable high voltage type flashlamp suitable for use in the linear array according to the present invention is described in U.S. Pat. No. 4,059,389, wherein the ignition structure comprises a pair of spaced apart lead-in wires with spherically shaped terminations, a glass frit coating over lead-in wires and a coating of primer material over the frit-coated terminations. The primer may bridge the wire terminations or comprise separate spaced apart coatings on the respective terminations, with the filamentary combustible being in contact with both terminations to provide a conducting path therebetween.

When the flashlamps are mounted and positioned on circuit strip 18, the lead-in wires 11a, 11b, etc., are bent at a right angle, as illustrated, so that all of the tubular envelopes of the lamps are positioned with the longitudinal axes thereof substantially parallel to the surface of the printed circuit strip 18 and arranged in a substantially coaxial alignment along a common longitudinal axis CA. Further, as described in copending application Ser. No. 072,526, assigned to the present assignee, the three lamps 11–13 at the top half of the array are inverted with respect to the three lamps 14–16 at the bottom half of the array.

Referring to FIG. 2, the circuit strip 18 has a "printed circuit" thereon for causing sequential flashing of the lamps by applied firing voltage pulses. In this particular embodiment, essentially the entire printed circuit is provided on one surface of the strip 18, namely, the obverse side of the strip over which the flashlamps are positioned. The substrate of strip 18 comprises an insulating material, such as polystyrene, or phenolic, etc., and the pattern of conductor runs may be provided on the surface thereof by means such as silk screening, chemical etching of a copper cladding, etc. Each end of the circuit strip 18 functions as a connector tab, denoted as 18a and 18b respectively. The tab 18a is provided with a pair of electrical terminals 20 and 22, and similarly, the tab 18b is provided with a pair of terminals 20' and 22' for contacting terminals of a camera socket for applying firing voltage pulses to the array. As will be described in more detail hereinafter, the terminal 20 forms part of and is connected to a common circuit conductor run 24 which is disposed parallel to the right-hand edge of the circuit strip (as viewed in FIG. 2) and connected electrically to one lead-in wire of each of the flashlamps 14–16, and terminal 20' forms part of and is connected to a common circuit conductor run 25 which is disposed parallel to the left-hand edge of the circuit strip and connected electrically to one lead-in wire of each of the flashlamps 11–13.

The terminations of conductor runs 24 and 25 are spaced-apart at the midportion of circuit strip 18, because of other circuit runs crowded therebetween, and are interconnected by a crossover, or jumper means to be described in detail hereinafter. As a result, terminals 20 and 20' function as part of a "ground" circuit and are shown as having an enlarged configuration for reducing the likelihood of lamps being accidentally flashed by electrostatic voltage when the array is handled.

The circuit strip-lamp assembly, which forms the functional core of the unit 10, is enclosed in a comparatively simple and compact housing construction of a cost-efficient and versatile design. More specifically, the unit enclosure comprises just two components, namely, a rear housing member 26 and a light-transmitting cover panel 28. Referring also to FIG. 3, housing member 26 has an elongated configuration and includes a longitudinal channel 30 which has a cross-section which is substantially semi-rectangular. The circuit strip-lamp assembly is located within channel 30, and cover panel 28 is attached to the front of the housing 26 so as to enclose the lamps. As illustrated in FIG. 1, the ends of tabs, 18a and 18b of the circuit strip extend beyond the opposite ends of the elongated cover panel 28 to expose the terminals 20, 22 and 20', 22', thereon for connection to a camera.

The rear housing member 26 further includes outer flanges 32 and 34 whch adjoin the opposite sidewalls 36 and 38, respectively, of the semi-rectangular channel. Formed in these outer flanges are a plurality of symmetrical segments of parabolic reflector cavities, with each pair of reflector cavity segments 11', 11", etc., on opposite sides of the channel 30 being associated with a respective one of the flashlamps 11, etc. Housing member 26 is molded of an insulating plastic material, such as polystyrene, but reflective surfaces are provided adjacent to all the flashlamps by covering all of the surfaces of channel 30 (i.e., sidewalls 36 and 38 and rear wall 40) and the surfaces of the outer flanges 32 and 34 which face the cover panel, including the parabolic reflector cavity segments 11', 11", etc., with a continuous coating of conductive reflective material 42. For example, the channel and front surfaces of the flanges may be metalized such as by an aluminum vacuum deposition process. In this manner, member 26 integrally functions as a compact, cost-efficient, multicavity reflector member in addition to functioning as a rear housing enclosure. It will be noted that the lamp-carrying terminal strip is located substantially internal to this reflector member. Further referring particularly to FIGS. 1 and 3, it will also be noted that the common longitudinal axis CA of the linear array of flashlamps 11, etc., is substantially parallel to the longitudinal axes of printed circuit strip 18 and channel 30 and lies in a plane which symmetrically intersects the parabolic reflector cavity segments 11′, 11″, etc., on opposite sides of the channel. Hence, portions of the reflector cavities and sidewall reflective surfaces are located behind the longitudinal center line of the lamps so that as each lamp is flashed, light is projected forwardly of the array.

The housing member further includes integral extensions 47 and 47′ at the opposite ends thereof which partly surround and protect the extending connector tabs 18a and 18b of the printed circuit strip 18, exposing the terminals thereon, and also function to facilitate mechanical attachment to the camera socket. In accordance with the present invention, the printed circuit strip 18, secured in the housing channel 30 by means to be described in detail hereinafter.

The light-transmitting cover panel 28 basically comprises a planar strip of clear plastic material, such as polystyrene, and may be attached to the plastic rear housing member 26 by conventional methods, such as the use of cement or ultrasonic welding about the periphery. Improved structural rigidity and cost-efficiency, however, are provided by a preferred method of attachment described in copending application Ser No. 072,529, assigned to the present assignee. Referring to FIGS. 1 and 2, the cover panel molding includes four rectangular corner posts 70 which fit into corresponding slots 72 in the housing member flanges and straddle respective ends thereof. These corner posts grip the sides of the housing member 26 on the outside and are ultrasonically welded thereto. This secures the ends of the panel and prevents spreading of the respective ends of the housing. Along each side of the midportion of the cover are provided four cylindrical posts 74 (a total of eight) which fit into corresponding holes 76 in the rear housing. Ultrasonically heated and pressure-formed rivet heads (not shown) are formed on the ends of these posts to secure the longitudinal edges of the cover to the housing. Further, cover panel 28 includes a transverse web 78 which projects from the center thereof and fits within slots 80 in the sidewalls 36 and 38 of the housing channel 30. Web 78 thereby bridges the housing channel to provide oppositely directed forces with respect to the four corner posts 70 so as to prevent collapse of the central portion of the cover panel and assure a snug fit. Ultrasonic welding is also employed on each side of the web 78 which engages a slot 80.

As described in copending application Ser. No. 072,534, assigned to the present assignee, the integral transverse web 78 of cover 28 also provides a light-attenuating partition between the tips of lamps 11 and 14 to prevent sympathetic flashing. Additional transverse webs 82 of reduced size are also provided as integral parts of cover 28 to prevent sympathetic flashing between the remainder of the lamps.

When fully assembled, the completed photoflash unit according to the invention is provided with a plug-in connector tab 18a at the lower end thereof which is adapted to fit into a camera or flash adapter. A second plug-in connector tab 18b is provided at the top end of the unit whereby the array is adapted to be attached to the camera socket in either of two orientations, i.e. with either the tab 18a or 18b plugged into the socket. The lamps are arranged in two groups of three disposed on the upper and lower halves, respectively, of the elongated array. Upper group 57 comprises lamps 11–13, and lower group 58 includes lamps 14–16; the reflector cavity segments 11′, 11″, etc., along with the reflective channel sidewalls, are associated with the respective lamps so that as each lamp is flashed, light is projected forwardly of the array. The lamps are arranged and connected so that when the array is connected to a camera by the connector tab 18a (such as illustrated in FIG. 1 for the case of camera 60 shown in phantom) only the upper group 57 of the lamps will be flashed, and when the array is turned end for end and connected to the camera by the other connector tab 18b, only the then upper group 58 of lamps will be flashed. By this arrangement, only lamps relatively far from the camera lens axis are flashable, thus reducing the undesirable red-eye effect.

Referring to FIG. 2, the circuit board 18 has a "printed circuit" thereon for causing sequential flashing of the lamps by firing voltage pulses applied to the terminals 20, 22, 20′, 22′. The top and bottom of the printed circuitry preferably are reverse mirror images of each other. The circuit located on the upper half of the circuit strip 18 and activated by the pair of terminals 20 and 22 includes three lamps 11–13 arranged in parallel across the input terminals. The circuit also includes two normally open (N/O) radiant-energy-activated connect switches 61 and 62 for providing sequential flashing of the lamps 11–13 in response to firing pulses successively applied to the input terminals 20 and 22. Each N/O connect switch is responsive to the flashing of an associated lamp to form a closed circuit condition.

Terminal 22 is part of a "hot" or signal circuit conductor run 65 that extends upwardly through the lower half of the circuit strip 18 and terminates at a lead-in wire of lamp 11 and one terminal of the N/O switch 61 in the upper half of the circuit strip. The other side of switch 61 is connected to a lead-in wire of lamp 12 and to one terminal of N/O switch 62 via circuit run 66. Circuit run 67 then connects the other terminal or switch 62 to a lead-in wire of lamp 13.

On the other half of the circuit strip, terminal 22′ is part of a signal circuit conductor run 68 that extends downwardly through the upper half of the circuit strip 18 and terminates at a lead-in wire of lamp 14. The remainder of the circuitry in the lower half of the circuit strip is similar to that described above for the upper half of the circuit strip.

As described hereinbefore, the terminals 20 and 20′ comprise integral portions of respective common circuit conductor runs 24 and 25. These common circuit runs respectively terminate at conductor termination pads 63 and 64, respectively, near the midportion of the circuit strip and are spaced apart thereat to provide clearance for the signal circuit conductor runs 65 and 68 to extend therebetween, as shown in FIGS. 2, 4 and 5. To enable activation of lamp group 57 by an input pulse applied across terminals 20 and 22, some means must be provided for interconnecting common run 24 with the spaced apart common run 25 (connected to a terminal of each of the lamps 11–13) without interfering with the signal conductor runs 65 and 68. The same interconnecting means is necessary to enable activation of lamp group 58 from terminals 20′ and 22′, one terminal of each of the lamps 14–16 being connected to run 24.

In accordance with a preferred embodiment of the present invention, this common circuit crossover between the spaced-apart conductor runs 24 and 25, together with secure attachment of the printed circuit strip 18 to the rear wall 40 of the housing channel, is accomplished by use of a common wire stape 83. Referring particularly to FIGS. 4 and 5, a wire staple 83, formed of electrically conductive material, is inserted from the rear of the housing through a pair of holes 84a and 84b in the rear wall 40 of the housing channel (FIG. 5) and a pair of holes 85a and 85b in circuit board 18 and then crimped over on the conductor-carrying surface of the circuit board. More specifically, in assembling the unit, circuit strip 18 is placed in channel 30 so that the plane of the surface strip is parallel to rear wall 40 and the side of the circuit strip opposite the conductor-carrying surface faces the rear wall 40. The circuit strip is then positioned within the housing channel with the spaced apart holes 85a and 85b therein respectively in alignment with the holes 84a and 84b in the rear wall 40 of the housing channel. Staple 83 has a pair of legs 83a and 83b which extend through both wall 40 and circuit strip 18, while a center region 83c of the staple is positioned on the exterior side of the rear wall 40 of the housing channel. Staple leg 83a is shown passing through the aligned holes 84a and 85a of the rear wall and circuit strip, respectively, and staple leg 83b is shown passing through the aligned holes, 84b and 85b of the rear wall and circuit strip. When the staple is fully inserted with the center region 83c pressed against the exterior of the housing, the staple legs 83a and 83b are bent over the conductor-carrying surface of the circuit board so as to secure circuit strip 18 to the rear wall 40 of the housing channel, with each of the legs being in contact with a respective one of the conductive pads 63 and 64 of the circuit runs 24 and 25. The staple legs 83a and 83b are bent outwardly away from each other and in contact, respectively, with the conductive coating 42 on the opposite sidewalls 38 and 36 of the housing channel 30. More specifically, the bent over portion of staple leg 83a is shown in contact with the common run termination pad 63 and the conductively coated sidewall 38, and staple leg 83b is shown in contact with the common run termination pad 64 and the conductively coated sidewall 36. In this manner, the common circuit conductor runs 24 and 25 are connected to the conductive coating 42 on the walls of channel 30, and the electrical circuit ground of the unit is extended to the exterior of the rear side of the unit housing to further enhance the overall electrostatic protection, as will be further described hereinafter.

The wire staple 83 can be installed as previously stated, or it can be force driven through the housing member and circuit board if those respective components are made of a suitable material. In one specific implementation, with wire used to form the staple was 0.020 diameter Niron, a class of nickel-iron alloys obtainable from Wilbur B. Driver, Co. This wire is used, as can other wires with similar properties, because it is resistant to corrosion and rusting, which can cause the loss of electrical contact between the staple and the conductor pad 63 or 64. Flat wire of different dimensions can also be used.

Returning now to the description of the printed circuit configuration, the first lamp to be fired, namely, lamp 11, is connected directly across the input terminals 20 and 22. The N/O connect switches 61 and 62 are series connected in that order with lamp 13, which is the third and last lamp to be fired, across the input terminals 20 and 22. And, the second lamp to be fired (lamp 12) is series connected with the N/O switch 61.

The radiant-energy-activated N/O connect switches 61 and 62 are in contact with and bridge across the circuit runs that are connected to them. The material for the connect switch is selected to be of the type initially having an open circuit or high resistance, the resistance thereof becoming nearly zero or a lower value when the material receives radiation in the form of heat and/or light from a respective adjacent lamp, upon the lamp being flashed. For this purpose, each of the connect switches is respectively positioned behind and near to an associated flashlamps. More specifically, switch 61 is positioned behind lamp 11, and switch 62 is positioned behind lamp 12.

The high resistance paste used to make switches 61 and 62 may comprise a known mixture of silver compound and a binder. According to a preferred embodiment, however, the material comprises a silver compound such as silver carbonate, a binder such as polystyrene resin, a large proportion of electrically non-conductive inert particulate solids, such as titanium dioxide, and a protective oxidizing agent such as barium chromate. For example, as described in copending application Ser. No. 021,398, filed Mar. 19, 1979, and assigned to the present assignee, the dired composition of a specific silk screenable high resistance material comprises 67.43% silver carbonate, 22.48% titanium dioxide, 8.99% glass beads, 0.11% barium chromate, 0.07% lecithin as a wetting agent, and 0.91% polystyrene resin as a binder. The barium chromate was included to enhance environmental stability, as described in U.S. Pat. No. 4,087,233. The mixture is made into a paste by ball milling in a suitable solvent such as butyl cellosolve acetate. The solids content may be adjusted to suit the method of switch application. For silk screening over a circuit strip, it is preferred to adjust the solids content to about 74%.

The circuit on the circuit strip 18 functions as follows. Assuming that none of the three lamps on the upper half of the unit have been flashed, upon occurrence of the first firing pulse applied across the terminals 20 and 22, this pulse will be directly applied (via run 65 and the combination of runs 24, 25 and staple 83) to the lead-in wires of the first-connected flashlamp 11, whereupon lamp 11 flashes and becomes an open circuit between its lead-in wires. Heat and/or light radiation from the flashing first lamp 11 is operative to activate the N/O connect switch 61. As a result, the radiation causes the normally open connect switch 61 to become a closed circuit (or a low value or resistance), thereby connecting the circuit strip terminal 22 electrically to the second lamp 12 via circuit run 66. By the time this occurs, the firing pulse has diminished to a value insufficient to cause the second lamp 12 to flash. When the next firing pulse occurs, it is applied to the lead-in wires of the second lamp 12 via the now closed connect switch 61, whereupon the second lamp 12 flashes and becomes an open circuit between its lead-in wires, with the lamp radiation causing the connect switch 62 to assume a near zero or low resistance. When the next firing pulse occurs, it is applied via the now closed connect switches 61 and 62 to the lead-in wires of the third flashlamp 13, thereupon causing the lamp to flash. Since this lamp is the last lamp in the active circuit, it does not matter whether its lead-in wires are an open or closed circuit after flashing. When the flash unit is turned around and the other connector tab 18b attached to the camera socket, the group 58 of the lamps that then becomes upper most and farthest away from the camera lens will be in the active circuit and will be flashed in the same manner as has been described. In a preferred embodiment, the lamps 11, etc., are high voltage types requiring about 2,000 volts, for example, at low current for flashing, and they can be fired by impacting or stressing a piezoelectric element in the camera.

The high degree of electrical sensitivity needed in high voltage flashlamps gives rise to distinct problems of inadvertent flashing during handling of the array package. Any static charges on equipment and personnel can cause the lamp to flash. Accordingly, as described in the aforementioned copending application Ser. No. 072,251, electrostatic protection is provided by the rear housing member 26 in a cost-efficient manner by electrically connecting the conductive coating 42 to the common circuit conductor. By virtue of the present invention, this connection is automatically provided by staple 83, the crimped legs 83a and 83b of which contact both the coated channel sidewalls and common circuit runs 24 and 25. In this manner, continuous conductive surfaces on rear wall 40 and sidewalls 36 and 38 of channel 30, and on the reflector cavities and front faces of outer flanges 32 and 34, provide a protective electrostatic shield about three sides of the sensitive circuit strip 18 and the lamps 11-16 mounted thereon. Protection against electrostatic charges about the front face of the unit is provided in a manner following the teachings of U.S. Pat. No. 4,133,424. Cover panel 28 is provided with eight openings 86 distributed throughout the length thereof, as illustrated, and housing member 26 further includes eight metal-coated posts, or projections, 88 which respectively fit into the front face openings 86. Preferably, the conductive reflector projections protrude through the openings 86 in the cover panel beyond the exterior surface thereof, as shown in FIG. 3, so as to assure electrical contact with any charged object such as a user's hand, which may touch the array housing.

As illustrated in FIGS. 1 and 2, projections 80 are symmetrically disposed on the front face of the housing flanges 32 and 34 between reflector cavity segments 11', 11'' and 12', 12''; 12', 12'' and 13', 13''; 14', 14'' and 15', 15''; 15', 15'' and 16', 16''. These projections 88 are integral molded portions of the insulating plastic material of housing 26 which are covered with the continuous conductive reflective coating 42. Accordingly, the conductive projections 88 are connected to the common circuit conductors 24 and 25 via the staple 83.

In accordance with the present invention, staple 83 complements the electrostatic protection provided by the front face projections 88 in that the exposed portion 83c of the staple extends the circuit ground of the unit beyond the exterior surface of the rear of the housing, as shown in FIG. 5 so as to assure electrical contact with any charged object which may touch the back of the array housing. Hence, as employed in the preferred embodiment illustrated, the array construction employing stable 83 in accordance with the invention economically and conveniently provides the combined functions of (1) locating and securing the circuit board within the housing channel, (2) providing an interconnecting jumper between spaced-apart common circuit runs on a circuit board, (3) connecting the circuit runs to the shield coating 42, and (4) extending circuit ground to the exterior of the unit at the back of the housing. Of course, in photoflash unit embodiments which do not employ the spaced-apart common circuit runs, the jumper functions is unnecessary and only one of the staple legs need contact a common circuit conductor run. Further, in photoflash units which do not employ a protective shield such as coating 42, the staple legs may be bent inwardly or outwardly with no need to contact the sidewalls of the unit. Hence, staple 83 may be employed solely for the dual functions of securing the circuit board to the housing and extending circuit ground to the exterior of the unit.

Accordingly, although the invention has been described with respect to specific embodiments, it will be appreciated that modifications and changes may be made by those skilled in the art without departing from the true spirit and scope of the invention. For example, the construction is not limited to linear high voltage arrays. The array may be single ended, with a connector on only one end; the lamps may all be oriented in one direction; and the number of lamps may vary. For example, a higher output lamp array of the double ended type may comprise two lamps of much larger volume positioned in each of the upper and lower groups housed in a package of slightly larger dimensions.

We claim:

1. A multilamp photoflash unit comprising, in combination, a printed circuit board having lamp-firming circuitry on a surface thereof, an array of electrically ignitable flashlamps disposed on said circuit board, each of said flashlamps having a pair of lead-in wires connected to said circuitry, said circuitry including a common circuit conductor run on said surface of the circuit board connected electrically to one lead-in wire of each of said array of lamps, a housing member having a channel within which said printed circuit board is located, said circuit board being disposed substantially parallel to a wall of said channel with said wall facing the opposite side of said circuit board from said surface thereof, a light-transmitting cover panel attached to said housing member and enclosing said flashlamps therein, and a staple of conductive material having a pair of legs extending through both said wall of said housing channel and said circuit board and having a center region positioned on the exterior of said housing on the side of said channel wall opposite that facing the circuit board, said legs being bent over said surface of the circuit board so as to secure said circuit board to said wall of said housing channel by means of said staple, with at least one of said legs of the staple being in contact with said common circuit conductor run, whereby said staple provides electrostatic protection by extending electrical ground to the exterior of the unit.

2. The photoflash unit of claim 1 wherein said staple is comprised of non-corrosive material.

3. The photoflash unit of claim 1 wherein said circuit board is in the form of an elongated strip, said flashlamps are disposed in a linear array over said surface, said housing member has an elongated configuration with said channel longitudinally disposed therein, said channel has a cross-section which is substantially semi-rectangular, a continuous coating of conductive reflective material covers the rear wall and opposite sidewalls of said channel, said circuit board is parallel to the rear wall of said channel, said staple legs extend through the rear wall of channel for securing the circuit board thereto, and said legs of said staple are bent outwardly away from each other and in contact, respectively, with said coated opposite sidewalls of the channel, whereby said common circuit conductor run is connected to said conductive coating on the walls of said channel.

4. The photoflash unit of claim 3 wherein said circuit board and the rear wall of said housing member each have a pair of holes therethrough, each pair of holes being spaced-apart to accommodate the legs of said staple, said circuit board is positioned in said housing channel with said pairs of holes in alignment, and said staple legs extend through said aligned holes of the circuit board and housing.

5. The photoflash unit of claim 3 wherein said circuitry includes first and second common circuit conductor runs which are spaced-apart from each other on said surface of the printed circuit board, and each of the legs of said staple are in contact with a respective one of said first and second conductor runs, whereby said staple also functions as an interconnecting jumper between said first and second common circuit conductor runs.

6. The photoflash unit of claim 5 wherein said array of lamps is divided into first and second groups of two or more lamps each disposed on respectively opposite halves of said printed circuit strip over said surface thereof, said first common circuit conductor run is connected electrically to one lead-in wire of each of said first group of lamps and said second common circuit conductor run is connected electrically to one lead-in wire of each of said second group of lamps.

7. The photoflash unit of claim 6 wherein said printed circuit strip includes first and second connector-terminal means at respectively opposite ends thereof, said first connector-terminal means being located on the half of said circuit strip containing said first group of lamps and separated thereby from said second group of lamps, said second connector-terminal means being located on the half of said circuit strip containing said second group of lamps and separated thereby from said first group of lamps, said first common circuit run extends to said first connector-terminal means, said second common circuit run extends to said second connector-terminal means, a portion of said circuitry couples said first connector-terminal means to each lamp of said second group of lamps, another portion of said circuitry couples said second connector-terminal means to each lamp of said first group of lamps, and both of said coupling portions of circuitry include said staple, each of said coupling portions enabling flashing of a lamp in the group coupled thereto in response to flash activation signals applied to its associated connector-terminal means, thereby reducing the red-eye photographic effect.

8. The photoflash unit of claim 7 wherein the width of said printed circuit strip is about equal to the width of said channel, said first and second common circuit conductor runs have respective spaced-apart terminations about the midportion of said circuit strip, and said staple legs are bent over said surface of the circuit strip and in contact with respective ones of said terminations of said first and second runs.

* * * * *